(12) United States Patent
Pierrat

(10) Patent No.: US 8,278,156 B2
(45) Date of Patent: Oct. 2, 2012

(54) SPACER DOUBLE PATTERNING FOR LITHOGRAPHY OPERATIONS

(75) Inventor: Christophe Pierrat, Santa Clara, CA (US)

(73) Assignee: Cadence Design Systems, Inc., San Jose, CA (US)

(*) Notice: Subject to any disclaimer, the term of this patent is extended or adjusted under 35 U.S.C. 154(b) by 43 days.

(21) Appl. No.: 12/889,133

(22) Filed: Sep. 23, 2010

(65) Prior Publication Data

US 2011/0012237 A1 Jan. 20, 2011

Related U.S. Application Data

(63) Continuation of application No. 12/014,985, filed on Jan. 16, 2008, now Pat. No. 7,927,928.

(51) Int. Cl.
*H01L 21/335* (2006.01)

(52) U.S. Cl. ........ 438/142; 438/253; 438/397; 438/424; 438/642; 438/689; 257/E21.035

(58) Field of Classification Search ................ None
See application file for complete search history.

(56) References Cited

U.S. PATENT DOCUMENTS

| 5,140,388 A | 8/1992 | Bartelink |
| 6,455,438 B1 | 9/2002 | Yanagisawa et al. |
| 6,667,237 B1 * | 12/2003 | Metzler ..................... 438/690 |
| 2005/0079721 A1 | 4/2005 | Buerger, Jr. et al. |
| 2006/0147846 A1 * | 7/2006 | Lee ............................. 430/322 |
| 2006/0240361 A1 | 10/2006 | Lee et al. |

OTHER PUBLICATIONS

Huckabay et al., "Process results using automatic pitch decomposition and double patterning technology (DPT) at kleff<0.20", ASML, Inc., Photomask Technology, Proc. of SPIE, vol. 6349; 634910; 0277-786X/06; doi: 10.1117/12.687747; Oct. 20, 2006; pp. 1-11.

* cited by examiner

*Primary Examiner* — Kyoung Lee
(74) *Attorney, Agent, or Firm* — Kenyon & Kenyon LLP

(57) ABSTRACT

Systems and methods of semiconductor device fabrication and layout generation are disclosed. An exemplary method includes processes of depositing a layer of a first material and patterning the layer to form an initial pattern, wherein the initial pattern defines critical features of the layout elements using a single exposure; depositing spacer material over the first pattern on the substrate and etching the spacer material such that the spacer material is removed from horizontal surfaces of the substrate and the first pattern but remains adjacent to vertical surfaces of the first pattern; removing the initial pattern from the substrate while leaving the spacer material in a spacer pattern; filling the spacer pattern with final material; and trimming the tilled pattern to remove portions of the final material beyond dimensions of the layout elements.

17 Claims, 12 Drawing Sheets

SPACER DOUBLE PATTERNING FOR LITHOGRAPHY OPERATIONS

CROSS-REFERENCE TO RELATED APPLICATIONS

This application is a continuation of and claims the benefit of U.S. application Ser. No. 12/014,985 tiled Jan. 16, 2008 now U.S. Pat. No. 7,927,298, which is hereby incorporated herein by reference in its entirety.

TECHNICAL FIELD

The present invention relates to device manufacturing, and more particularly, some embodiments relate to semiconductor device lithography techniques

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages (HDLs), such as Verilog®, RTM® or VHSIC hardware description language (VHDL), for example. Through the use of HDLs, the designer creates an integrated circuit by hierarchically defining functional components of the circuit.

From the HDL or other high-level description, the actual logic cell implementation may he determined by logic synthesis, which converts the functional description of the circuit into a specific circuit implementation. The logic cells are then assigned physical locations in the device layout and their interconnections are defined. This is sometimes referred to as layout and routing. The placement and routing tools used by designers generally accept as their input a flattened netlist that has been generated by the logic synthesis process. This flattened netlist identifies the specific logic cell instances from a target standard cell library, and describes the specific cell-to-cell connectivity. By application of a physical design process, the logic cells of the netlist file are placed and routed, resulting in a layout tile. This layout, then, can be transferred or applied to the semiconductor substrate in a series of layers that collectively will Form the devices that make up the components of the integrated circuit.

A process by which such layers are patterned on the substrate is known as photolithography. During photolithography, a series of photomasks created from the layout file are used to transfer the layout onto the substrate layer by layer. There are different types of photomasks including binary, chrome-on-glass, attenuated phase-shifting masks (attPSM) and alternating phase-shifting masks (altPSM). A photomask, or more simply a mask, provides an image of the physical geometries of its associated integrated circuit layer or parts of a layer. Passing light through transparent sections defined by the mask elements transfers the layout pattern for the associated layer onto the wafer. The light pattern is passed through an imaging lens system and focused at the desired size on the wafer surface. A typical photolithography system uses UV light energy to project the mask pattern onto the wafer surface. The projected light pattern interacts with a photosensitive coating on the wafer and, depending on the coating used it can be cured or rendered susceptible to removal as a result of the exposure. Accordingly, the projection of the mask pattern onto the coating can be used to transfer the pattern to the wafer.

With a continuing desire to provide greater functionality in smaller packages and the evolution of complex system on-chip and mixed-signal designs, IC feature geometries are being driven to smaller and smaller dimensions. Also, the shrinking of feature dimensions can lead to an increase of the number of chips that can be obtained from a given wafer. However, the ability to project an accurate image of increasingly smaller features onto the wafer is limited by the wavelength of the light used, and the ability of the lens system to capture enough diffraction orders from the illuminated mask.

The minimum feature size that a projection system can print can be approximated by:

$$F = k1 * \frac{\lambda}{N_A}$$

where F is the minimum feature size, kl is a coefficient of process-related factors, $\lambda$ is the wavelength of light used and $N_A$ is the numerical aperture of the lens as seen from the wafer. Using currently available exposure tools, kl is limited to 0.25 (for a single exposure). With lithography processes using deep ultraviolet (DUV) light with wavelengths of 248 to 193 nm, minimum feature sizes of approximately 50 nm can be achieved. Accordingly, the resolution limit of conventional optical lithography technology is increasingly being challenged by the sub wavelength, or low-kl, dimensions of the critical IC feature geometries.

Not only are the critical dimension feature geometries decreasing in size in accordance with, or even faster than, Moore's Law predictions, the already large number of these feature geometries is growing at a dramatic rate as well. Furthermore, due to the necessity to mitigate optical proximity effect distortions through resolution enhancement techniques at the mask level, the overall polygonal figure count is skyrocketing. These critical feature geometries are patterned far more precisely as well due to the severity and sensitivity of the non-linear imaging. Extreme precision is required for sub wavelength, or low-kl, applications due to highly non-linear imaging behaviors, which often magnify mask errors by large factors and in non-intuitive manners.

With current lithography technology at wavelengths of 193 nm, optical characteristics of the light are affecting the ability to decrease feature sizes. One approach to increasing resolution is to move to a smaller wavelength or light. For example, some approaches have moved to light in approximately the 13.5 nm extreme UV range. However, such trends have proven difficult for a number of reasons and designers have moved to non-lithographic enhancements to is crease pattern density.

One class of technologies presently used to enhance feature density is referred to as double patterning or multiple patterning. There are several types of double patterning in use, the four most common being: double exposure, spacer mask, heterogeneous mask, and intermediate pattern accumulation. FIG. 1 is a diagram illustrating one example of spacer or self-aligned double patterning. Referring now to FIG. 1, in the first part of the process 100, a sacrificial layer 10 is laid down over a substrate comprising one or more hard mask layers 15, which are in turn deposited over the actual layer 20 that is to be patterned. Sacrificial layer 10 is typically made of poly-silicon.

Next as illustrated at 101 a spacer material 25 such as, for example, silicon nitride or silicon oxide is deposited over the wafer. Also illustrated at 101 is the patterning of a photoresist 30 to protect the spacer material in selected locations.

Accordingly, another mask layer is used to apply patterns of photoresist 30 at desired locations. As illustrated at 102, spacer material 25 is etched anisotropically, preferentially removing the spacer material on the horizontal surfaces. As a result, the structure illustrated in 103 remains, sacrificial layer 10 having been etched away. After a subsequent etch process is performed, the spacer pattern is transferred or etched to the underlying layer 20 as illustrated at 104.

FIG. 2 is a diagram illustrating a top view of the self-aligned double patterning process and the masks used to make the illustrated features. FIG. 2 shows patterns 12 created by sacrificial layer 10 and Mask A, patterns 14 created by spacer 35 after spacer etch, and components of logic devices 16 created by feature Mask B. With reference to FIG. 1, it is noted that mask B corresponds to patterning of photoresist 30.

Referring again to FIG. 2, as this Figure illustrates, once the polysilicon lines 12 are removed, spacer lines 14 are remaining and the density is approximately doubled. In order to remove the short 50 between each pair of spacer lines 14, a third mask layer mask C is used to remove the unwanted parts of spacer that short remaining trace lines as illustrated by dashed lines 45. As the examples provided in FIGS. 1 and 2 illustrate, for each feature line 12 of sacrificial layer 10 the process yields two lines 14, thereby doubling the density.

BRIEF SUMMARY OF EMBODIMENTS OF THE INVENTION

According to various embodiments of the invention semi-conductor devices and methods of manufacture are provided. In one embodiment, a method of patterning layout elements during semiconductor device fabrication, includes depositing a layer of a first material and patterning the layer to form an initial pattern, wherein the initial pattern defines critical features of the layout elements using a single exposure; depositing spacer material over the first pattern on the substrate and etching the spacer material such that the spacer material remains adjacent to the first pattern but is removed from other areas of the substrate; removing the initial pattern from the substrate while leaving the spacer material in a spacer pattern; tilling the spacer pattern with final material; and trimming the filled pattern to remove portions of the final material beyond dimensions of the layout elements. In a further embodiment, the method includes removing remaining spacer material after trimming the tilled pattern.

In one embodiment, the initial pattern is determined using a process that includes selecting first and second layout elements; defining a data representation of an outline of a resized first element; and combining the data representation of the outline of the first element with a data representation of the second element to arrive at a data representation of the initial pattern. In a further embodiment, combining the data representation of the outline of the first element with the data representation of the second element includes logical OR'ing the data representation of the outline of the first element with the data representation of the second element, and defining a data representation of an outline of a resized first element includes resizing the first layout element, selecting an outline of the resized data element and defining a data representation of the outline. Additionally, resizing the first layout element can include resizing the first layout element by two spacer widths in each dimension.

In another embodiment, determining the initial pattern includes selecting first and second layout elements; resizing the first layout element and defining a data representation of the resized first element; and combining the data representation of the resized first element with a data representation of the second element; and combining a data representation of the first element with the combination of data representations of the resized first element and the second element to arrive at a representation of the initial pattern. The process of combining the data representation of the outline of the first element with the data representation of the second element can include the process of logical OR'ing the data representation of the outline of the first element with the data representation of the second element. Additionally, the process of combining a data representation of the first element with the combination of data representations of the resized first element and the second element can include logical AND-NOT'ing a data representation of the first element with the combination of data representations of the resized first element and the second element. In me embodiment, the spacer pattern is used to define spaces between the layout elements rather than the elements themselves.

In another embodiment, a semiconductor device having a plurality of layers having a series of elements formed by a spacer double patterning process, is manufactured by a method including processes of depositing a layer of a first material and patterning the layer to form an initial pattern, wherein the initial pattern defines critical features of the layout elements using a single exposure; depositing spacer material over the first pattern on the substrate and etching the spacer material such that the spacer material remains adjacent to the first pattern but is removed from other areas of the substrate; removing the initial pattern from the substrate while leaving the spacer material in a spacer pattern; tilling the spacer pattern with final material; and trimming the filled pattern to remove portions of the final material beyond dimensions of the layout elements. In one embodiment, the layout elements are formed using only two mask layers.

In one embodiment, determining the initial pattern includes selecting first and second layout elements; defining a data representation of an outline of a resized first element; and combining the data representation of the outline of the first element with a data representation of the second element to arrive at a data representation of the initial pattern. Combining the data representation of the outline of the first element with the data representation of the second element can include logical OR'ing the data representation of the outline of the first element with the data representation of the second element. Defining a data representation of an outline of a resized first element can include resizing the first layout element, selecting an outline of the resized data element and defining a data representation of the outline. Additionally, resizing the first layout element comprises resizing the first layout element by two spacer widths in each dimension.

In a further embodiment, determining the initial pattern includes selecting first and second layout elements; resizing the first layout element and defining a data representation of the resized first element; and combining the data representation of the resized first element with a data representation of the second element; and combining a data representation of the first element with the combination of data representations of the resized first element and the second element to arrive at a representation of the initial pattern.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not he considered limiting of the breadth, scope, applicability of the invention. It should he noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed in various embodiments toward semiconductor devices and systems and methods for semiconductor processing. Particularly, some embodiments relate to spacer double patterning for semiconductor processing. In one embodiment, double patterning technology can be used to create logic elements for integrated circuit devices. In a further embodiment, the double patterning technology can be used to provide a self-aligned technique for enhanced resolution photolithography operations. In yet another embodiment, double patterning technology can be utilized to create features of differing widths without the extra mask operation needed in conventional spacer double patterning technology to add materials to create increased width elements.

Figure 3:
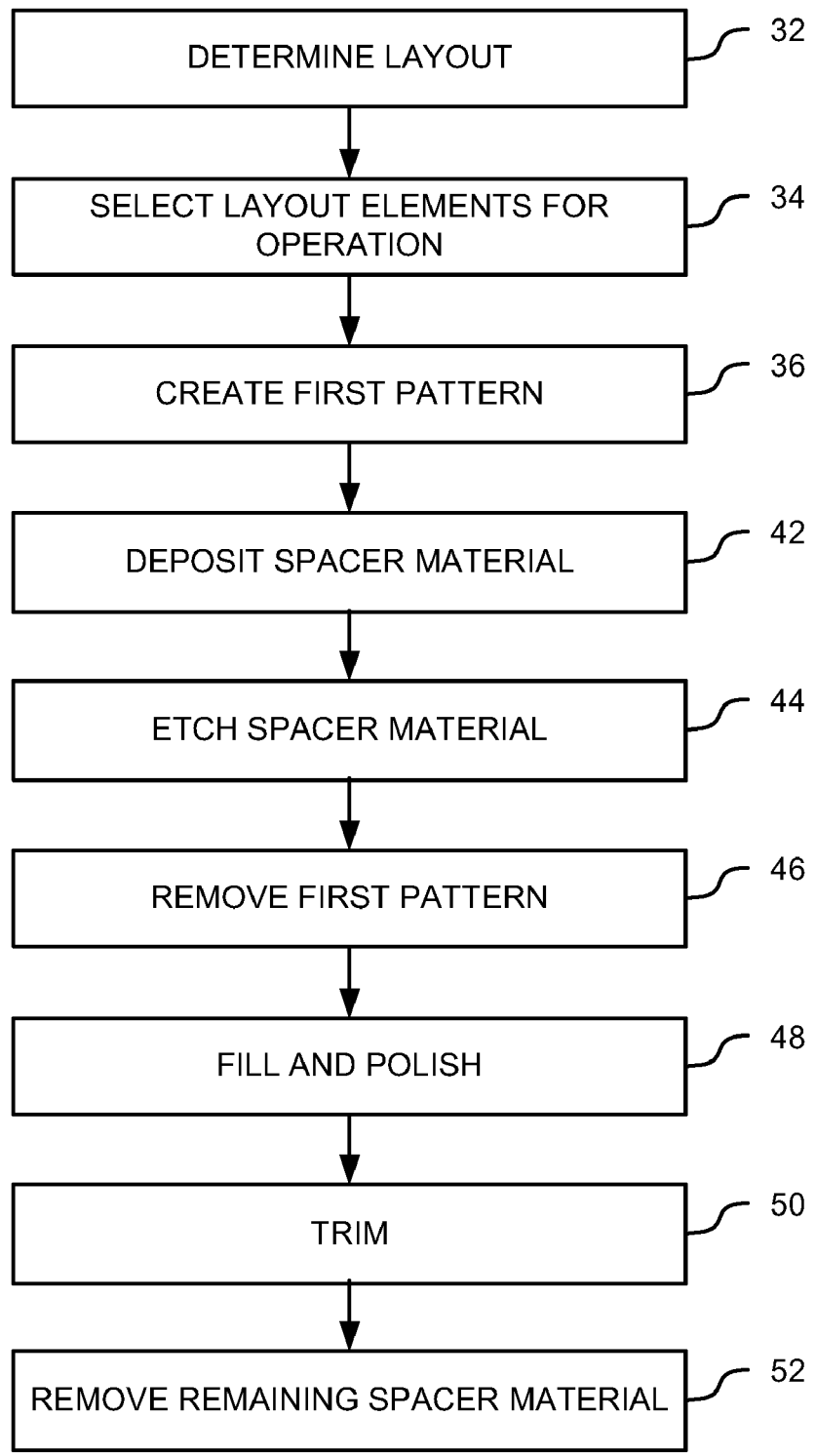
FIG. 3 is a diagram illustrating an example process for spacer double patterning to create logic elements in accordance with one embodiment of the invention.
Figure 4:
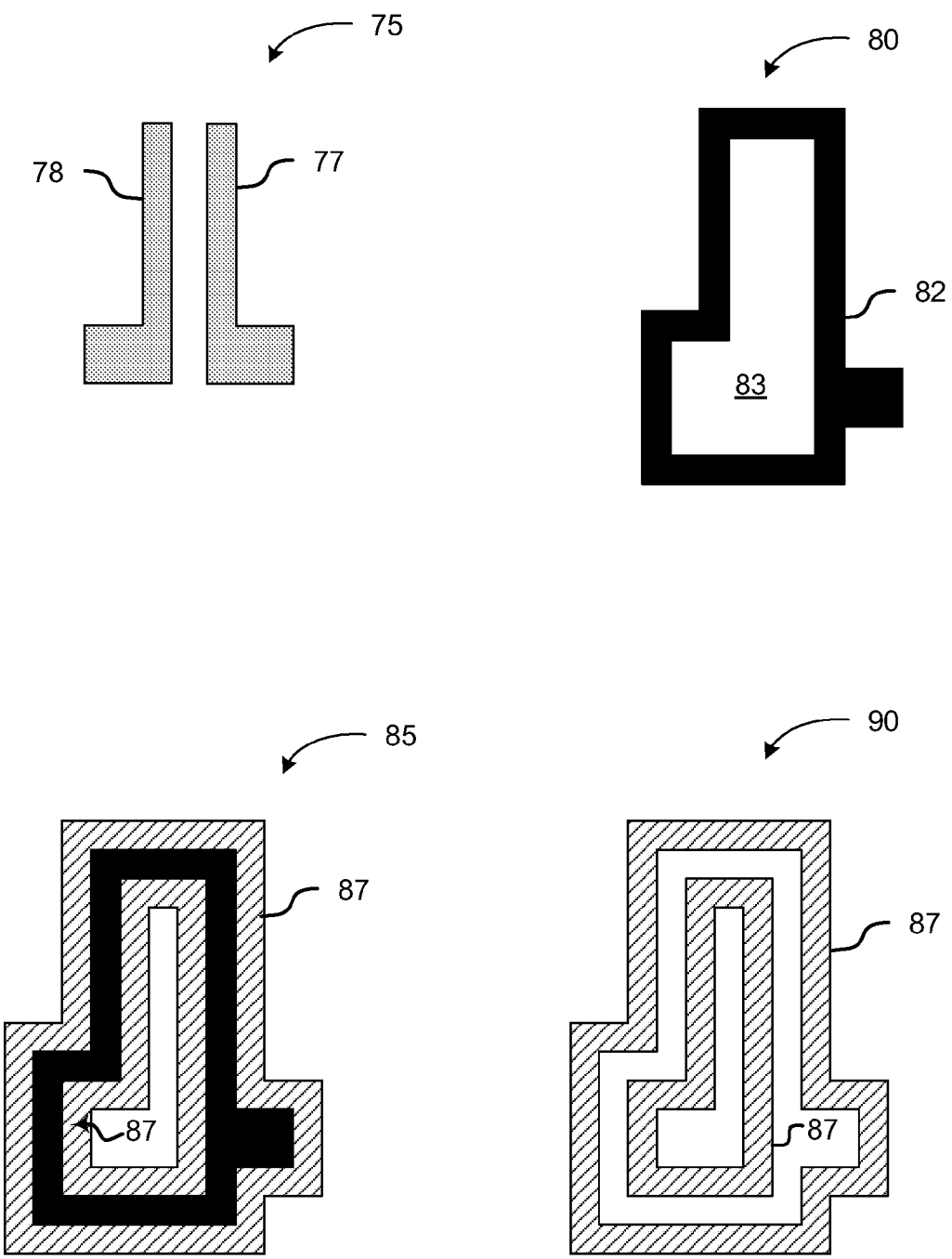
FIG. 4 is a diagram illustrating an example logic feature and example patterns used to create the logic feature in accordance with one embodiment of the invention.
Figure 5:
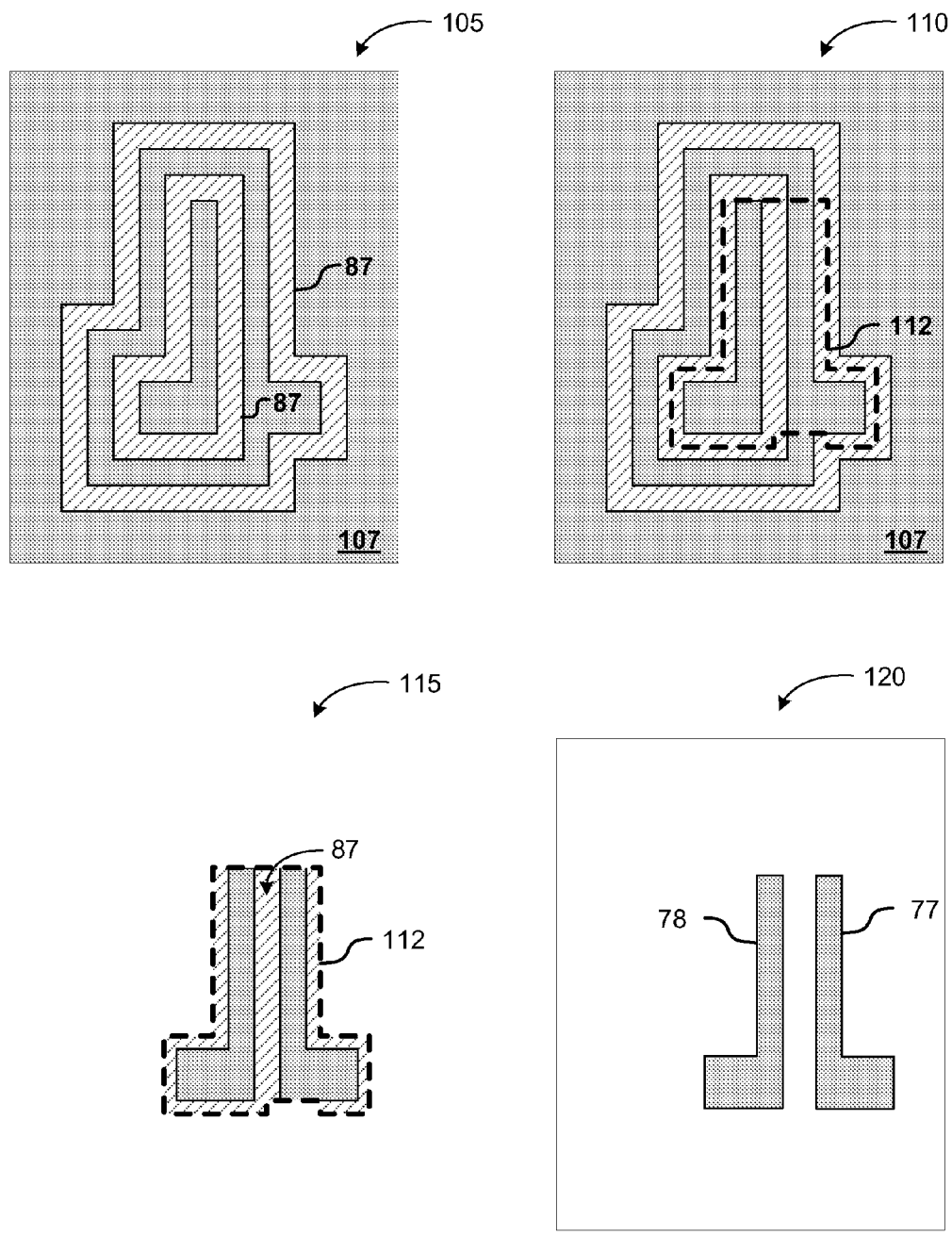
FIG. 5 is a diagram illustrating example patterns used to create a logic feature and a representation of the completed logic feature in accordance with one embodiment of the invention.

FIG. 3 is a diagram illustrating an example process for spacer double patterning to create logic elements in accordance with one embodiment of the invention. FIG. 4 is a diagram illustrating an example logic feature and example patterns used to create the logic feature in accordance with one embodiment of the invention. FIG. 5 is a diagram illustrating example patterns used to create the logic feature and a representation of the completed logic feature in accordance with one embodiment of the invention. Referring now to FIGS. 3, 4 and 5 at operation 32, a layout for a circuit is determined. For example, layout and routing techniques can be used to generate a layout for a desired circuit. The layout can include, for example, a plurality of logical elements along with their associated interconnects.

At operation 34, layout elements are selected for patterning. In one embodiment, the elements can be segregated into a plurality of groupings to facilitate the selection process. For example, in one embodiment, the elements are divided into two groups and paired for patterning. Accordingly, upon segregation, in on embodiment a pair of layout elements can be selected for patterning. To facilitate description of the systems and methods, a simple example of selected logic elements is assumed and an example process is described with reference to this simple example. After reading this description, it will become apparent to one of ordinary skill in the art how to implement the described systems and methods with other logic elements.

Referring now to FIG. 4, a pair of approximately L-shaped features are illustrated at 75. More particularly, the logic elements in this example include a left facing L-shaped element 78 and a right lacing L-shaped element 77. With continued reference to FIGS. 3 and 4, at operation 36, a first pattern is created in order to ultimately arrive at logic elements 77, 78. Continuing with the example set forth above, a first pattern that can be used to arrive at logic elements 77, 78 is illustrated in FIG. 4 at 80. Example embodiments of how the shape and contour of first pattern 80 are determined are described in detail below.

in the illustrated example, first pattern 80 includes a pattern of material 82 surrounding a space 83. In one embodiment, material 82 can comprise materials such as, for example, polysilicon. In some embodiments, the material for the first pattern can be referred to as sacrificial material 82, as this material is used to provide a foundation for the spacer material and is later discarded in these embodiments.

At operation 42, spacer material is deposited on the substrate. Much like conventional spacer double patterning techniques, the spacer material can be deposited over the entire substrate, covering first pattern 82 as well as the remaining portions of the substrate. In one embodiment, the spacer material can include materials such as silicon nitride or silicon oxide.

At operation 44, the spacer material can be etched from the substrate. Preferably, the etch operation is performed anisotropically, and is done so as to leave behind a pattern of spacer material adjacent to first pattern 82. An example of the remaining spacer material is illustrated in FIG. 4 at 85. As illustrated at 85, after the etch process, patterns of spacer material 87 remain adjacent to polysilicon material 82, while spacer material from other areas has been removed. In this operation, conventional spacer material deposition and etch techniques can he utilized. The width of spacer material 87 remaining after the etch process might be adjusted by, for example, controlling the thickness of the spacer layer, the characteristics of the etch process, and so on.

At operation 46, the polysilcon material 82 is etched away, leaving behind the patterns of spacer material 87 as illustrated at 90 in FIG. 4. Then, at operation 48, material can be deposited over the substrate to fill in the gaps between spacer material 87. In one embodiment, the material is deposited to cover the entire substrate including spacer material 87, and the surface is planarized using techniques such as, for example, chemical-mechanical polishing (CMP), resulting in this example in the pattern illustrated in FIG. 5 at 105.

Alternatively, in one embodiment operation 46 could he omitted, leaving polysilicon material 82 in place. In such an embodiment, material deposited at operation 48 could still be deposited to fill the gaps, and preferably is material that is compatible with polysilicon material 82.

At operation 51, a mask layer is applied to trim the pattern, which, in this example, is illustrated at 110 of FIG. 5 with dashed lines 112. As can be seen with reference to FIG. 5, dashed lines 112 surround desired layout elements 77, 78 along with adjacent spacer material 87. The area remaining after the trim operation is illustrated at 115. As shown, the remaining portions are layout elements 77, 78 and spacer material 87. At operation 52, the remaining spacer material 87 can be removed such as, for example, by an etch process, resulting in remaining layout elements 77, 78 as desired. This is illustrated in FIG. 5 at 120. In an alternative embodiment, the spacer material 87 could he removed before applying the trim layer.

It should be noted that in the illustrated example, line 112 is pseudo self-aligned—that is, even the trim level is slightly misaligned or mis-sized, the combined errors would have to he larger than half the size of the spacer before creating an error in the final dimension. This is true for all of line 112 in the illustrated example except for the place where it joins feature 77. Accordingly, this location could be carefully chosen as a non-critical area so that the impact is reduced if the dimension of feature 77 is slightly off.

As the above example serves to illustrate, through this series of operations, circuit elements such as logic elements 77, 78 can he created on a wafer using spacer double patterning techniques. With the above example, it is noted that only two mask layers were required to create logic elements 77, 78. Particularly, a first mask layer was used to create the initial pattern of material 82, and a second mask layer was used to trim the pattern. These would be analogous to Mask A and Mask B as described above with reference to FIG. 2. However, note that with the example described above with reference to FIG. 2, a third mask layer (Mask B) was needed to create the additional, larger width, features. As the above example further illustrates contrast to conventional spacer double patterning techniques, in one embodiment, layout elements of varying widths can be created. As the above example further illustrates, in another embodiment, the process can serve to self align two or more logic elements.

Figure 6:
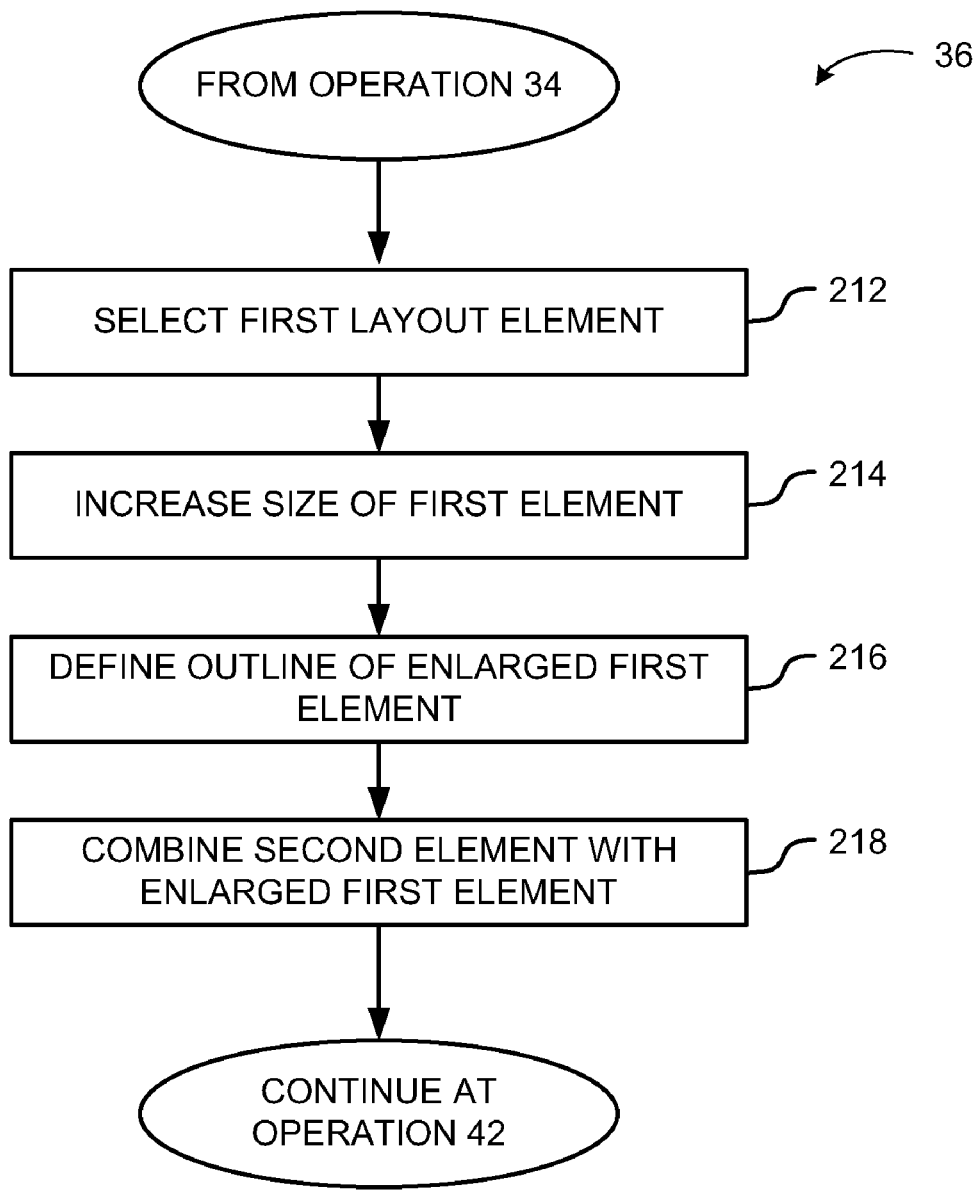
FIG. 6 is an operational flow diagram illustrating an example process for defining the initial pattern in accordance with one embodiment of the invention.

As described above with reference to FIG. 3, at operation 36 an initial pattern is defined and used in the process to arrive at the final desired elements. In one embodiment, definition of the initial pattern is an important process as it is the foundation for creation of the final layout elements. FIG. 6 is an operational flow diagram illustrating an example process for defining the initial pattern in accordance with one embodiment of the invention. Recall that, as described above, in one embodiment, the layout elements are segregated into groupings and a pair of layout elements are selected for patterning. Accordingly, at operation 212, one of the pair of layout elements to be patterned is selected as the first layout element.

Figure 7:
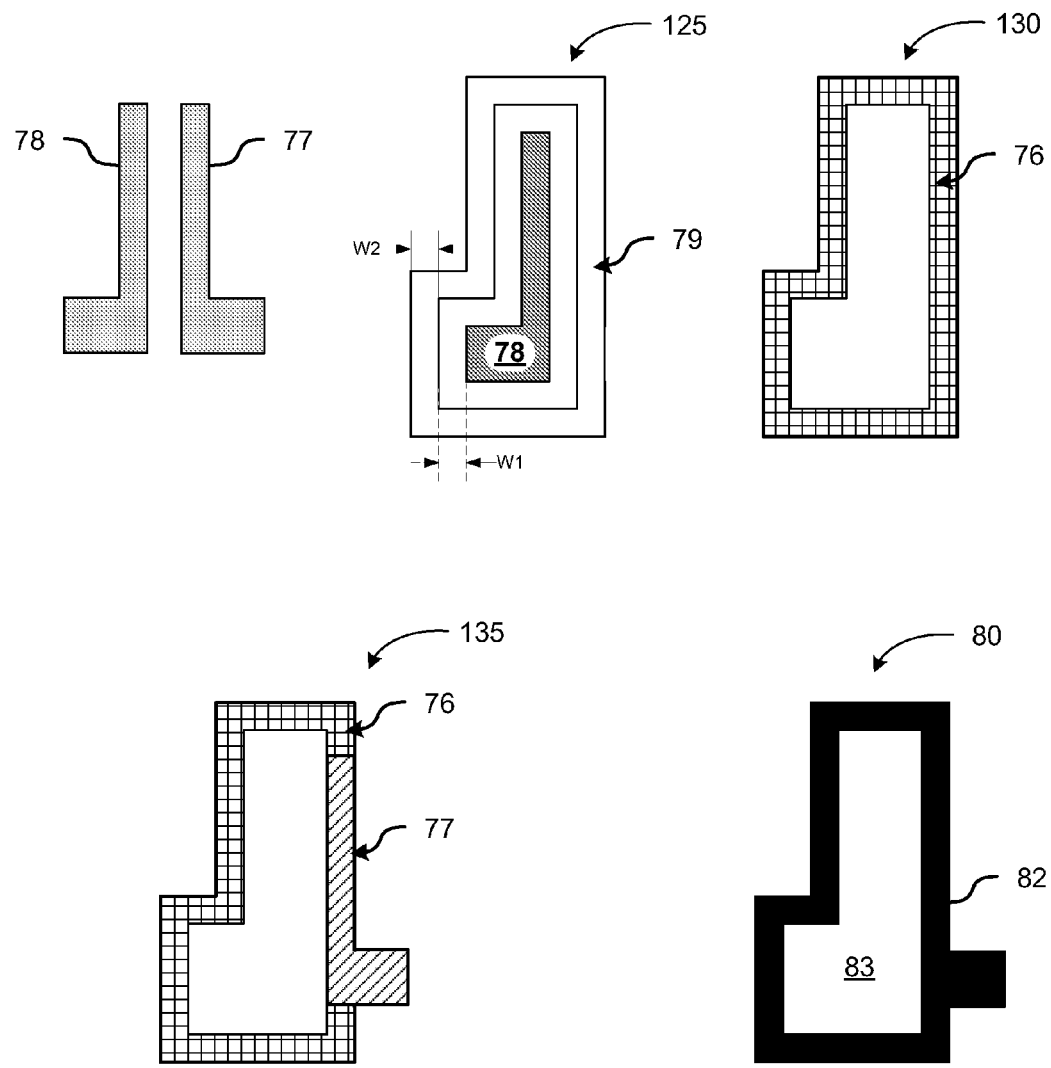
FIG. 7 is a diagram illustrating resizing of elements to create an initial pattern in accordance with one embodiment of the invention.

At operation 214, the size of the first element is increased. In one embodiment, as the example described above with reference to FIGS. 4 and 5 illustrates, a representation of the first layout element is increased in dimension by two spacer widths. In another embodiment, as another example, the element can be increased by a spacer width w1, and another width w2. However, w2 is preferably large enough to print reliably during the first exposure. More particularly, and with reference to FIG. 4, it can be seen in this example that layout element 78 is selected as the first layout element, and the left portion of outline 80 is an outline of this left and facing L-shaped enlarged from left-facing U-shaped 78 by three spacer widths. This is further illustrated at FIG. 7, wherein shape 78 is increased by spacer widths W1 and W2 (which, in one embodiment W1=W2) to arrive at shape 79.

With continued reference to FIG. 6, at operation 216 an outline 76 of the enlarged first element is defined. This outline 76 is illustrated at 130 in FIG. 7. Preferably, this outline has a feature width approximately equal to the spacer width. Although the creation of outline 76 is described with reference to enlarging a representation of the initial element and creating an outline of the enlarged element, after reading this description, it will become apparent to one of ordinary skill in the art how the outline can he derived using alternative techniques.

At operation 218, the second layout element is combined with the outline of the enlarged first layout element. An example is illustrated at 135 of FIG. 7, wherein a representation of element 77 is overlaid onto outline 76. With continued reference to FIG. 7, elements 76, 77 can be OR'd together to arrive at the initial pattern. The combination of these two elements can he seen at 80 as defined by patterned 82. Accordingly, this example illustrates a process for arriving at the initial pattern used in the above example. Also note that the width of the pattern 76 in FIG. 7 could be different from that of pattern 77.

Figure 8:
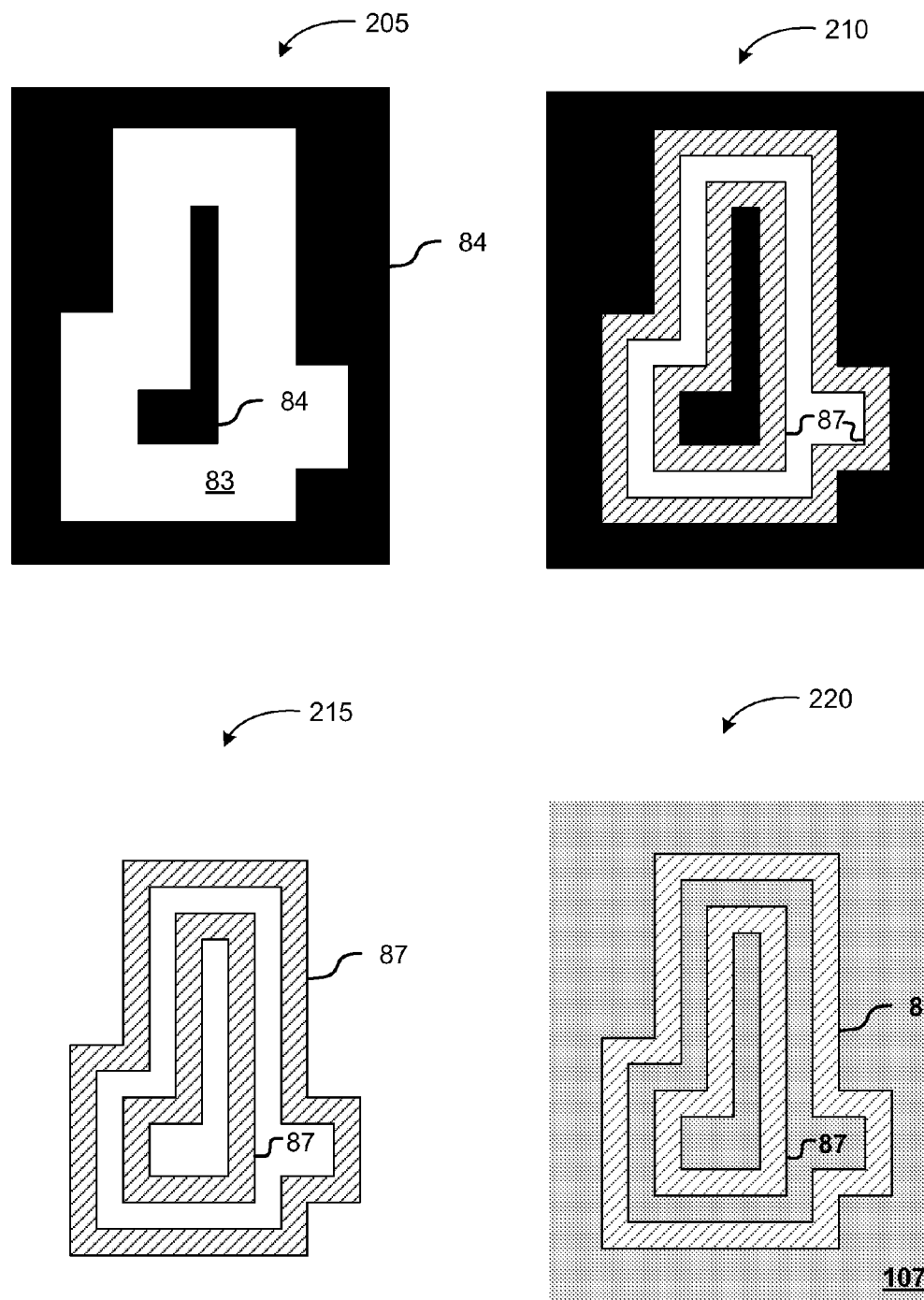
FIG. 8 is a diagram illustrating example patterns used to create a logic feature in accordance with one embodiment of the invention.
Figure 9:
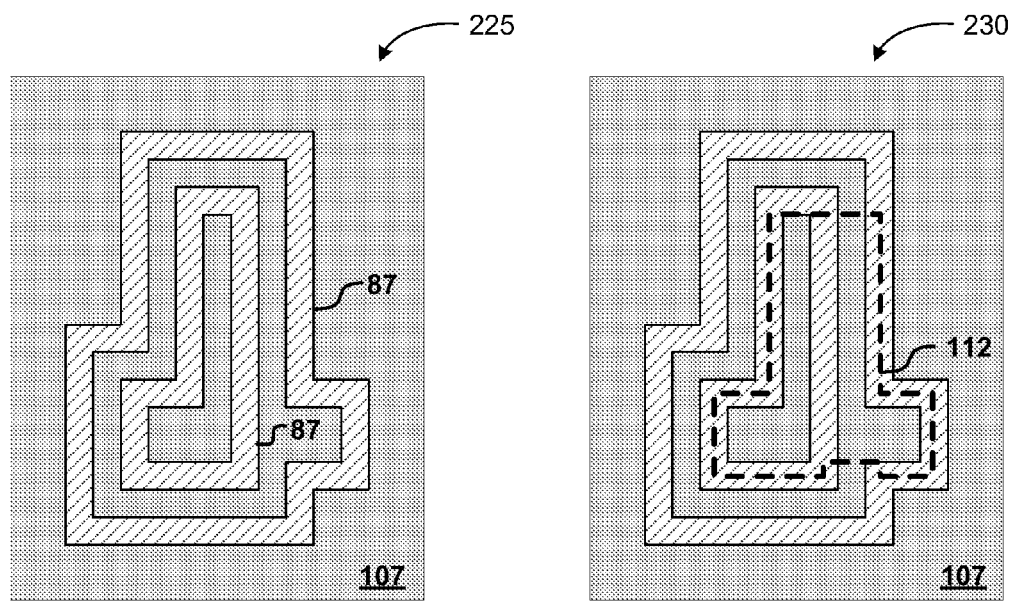
FIG. 9 is a diagram illustrating example patterns used to create a logic feature and a representation of the completed logic feature in accordance with one embodiment of the invention.
Figure 9:
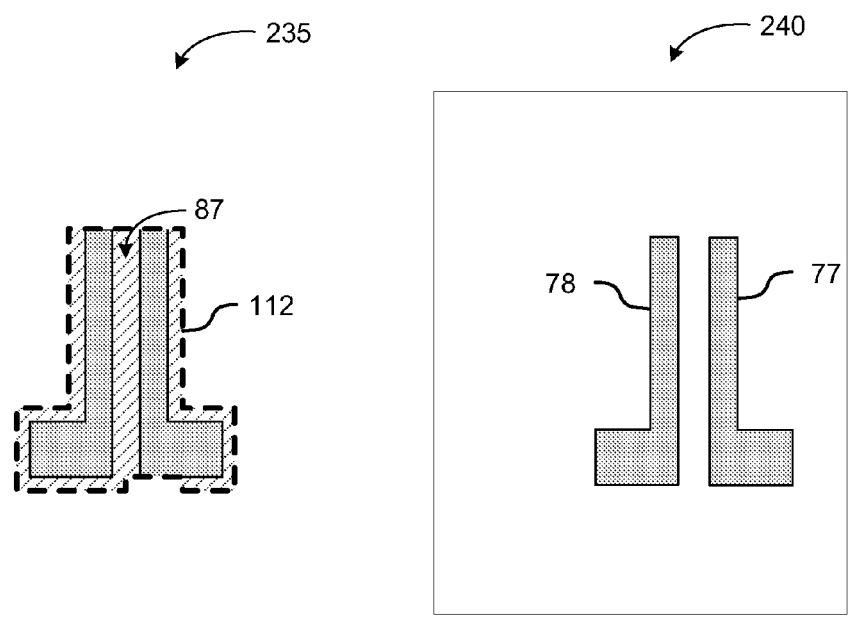

The process described above can be performed with different variations as would become apparent to one of ordinary skill in the art after reading this description. To further illustrate, an alternative embodiment is now described with reference to FIGS. 8 and 9, wherein an alternative initial pattern is derived and used to form elements 77, 78. Referring now to FIGS. 8 and 9, a first pattern is created as illustrated at 205. Similar to the process described above with reference to FIGS. 4 and 5, this first pattern is used as a pattern to define placement of spacer material. However, as is readily apparent by a comparison of the two first patterns in these examples, the first pattern illustrated at 205 is different from the first pattern illustrated at 70. As illustrated in FIG. 8, first pattern 205 includes a pattern of material 84 that will be used to define spacer placement and will ultimately be removed in subsequent processing operations. Spacer material can then be deposited over the substrate and etched away such that a width of spacer material 87 remains along the edges of initial pattern 84 as illustrated at 210. Upon removal of pattern 84 material, a pattern, of spacer material 87 remains as illustrated at 215. It may be noted at this point that the pattern of spacer material illustrated at 215 in the example of FIGS. 8 and 9 is the same pattern as illustrated in the prior example with reference to FIG. 4 at 90. Referring now to FIG. 9, it can he seen that the remaining operations in this example process are the same as those operations described above with reference to FIG. 5, which include: depositing a material and planarizing the surface using, for example, CMP as illustrated at 225; printing a trim level defined by lines 112 as illustrated at 230; and etching the new material and removing the remaining spacer material to arrive at the final patterns. Accordingly, with these two examples, it can be seen that although the initial pattern is different and arrived at using different techniques, both examples ultimately arrive at the same pattern of spacer material 87, which is ultimately used to create the final layout elements 77, 78. In one embodiment, the material deposited at 225 can be an appropriate semiconductor or other material used to create the logic components defined by the layout elements. For example, Silicon, Germanium, Gallium Arsenide, or other semiconductor materials can be deposited at 225 and, in this example, this deposited material would he the material that ultimately forms final layout elements 77, 78.

Figure 10:
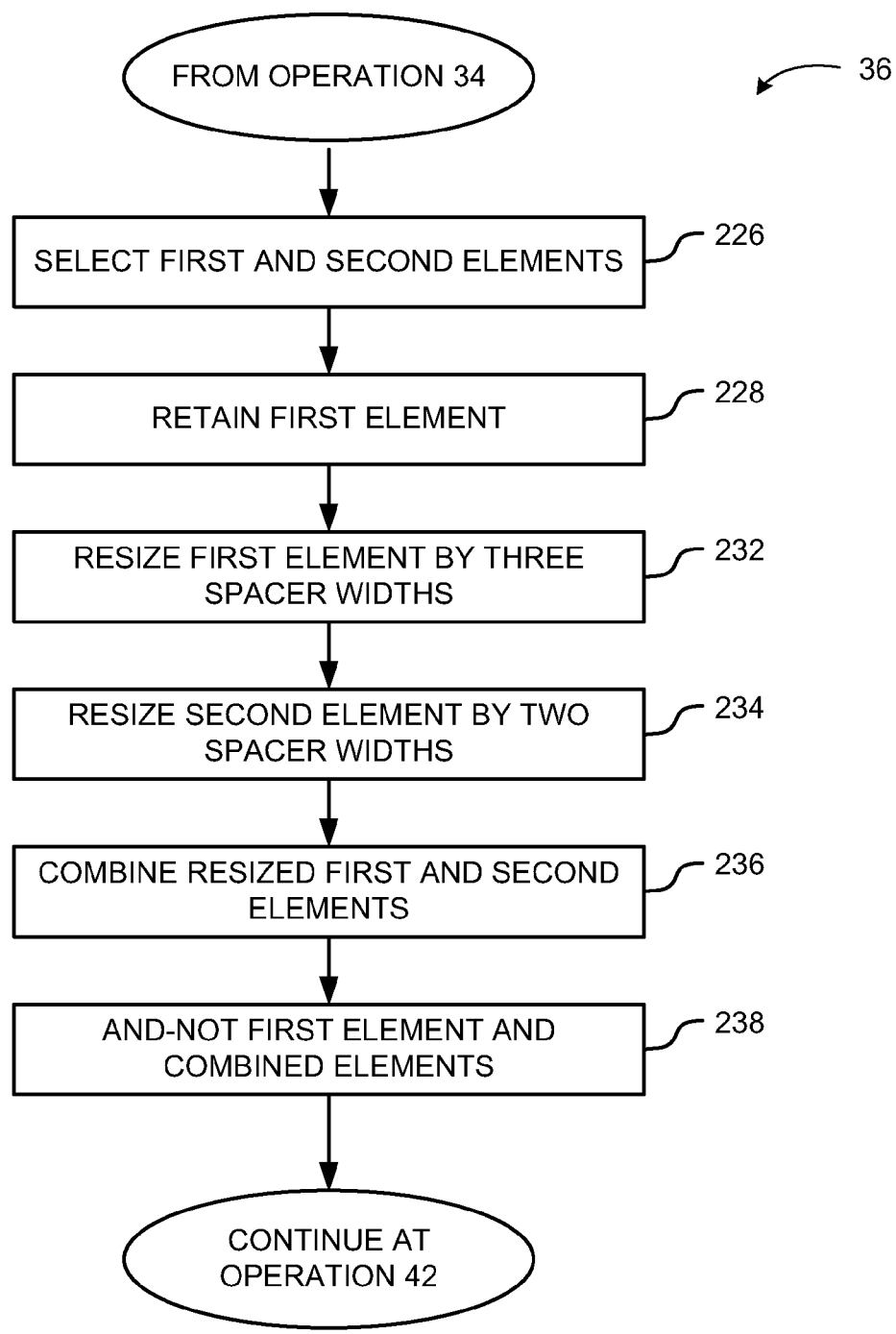
FIG. 10 is an operational flow diagram illustrating another example process for creating the initial pattern in accordance with one embodiment of the invention.
Figure 11:
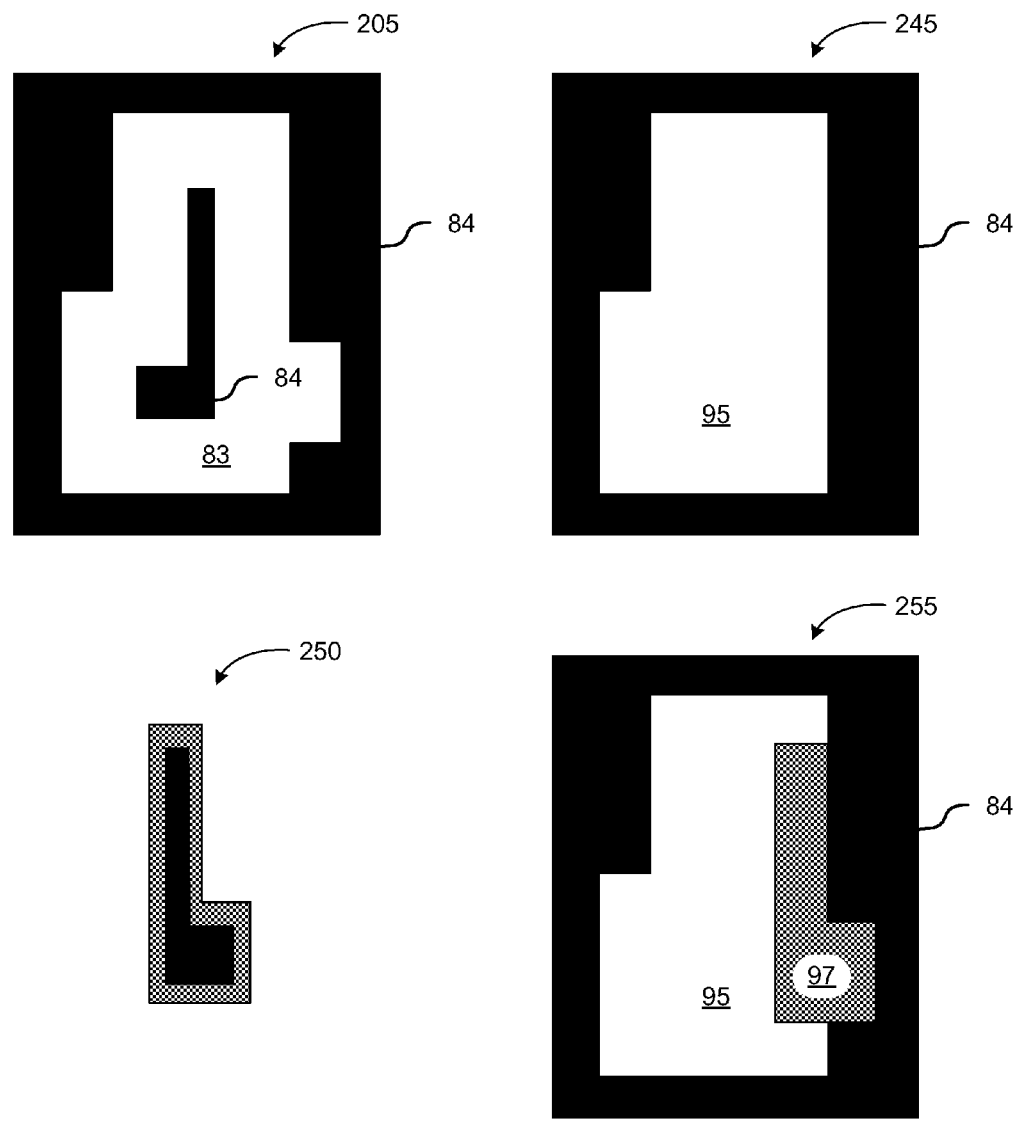
FIG. 11 is a diagram illustrating data representations that can be used to arrive at the initial pattern in accordance with one embodiment of the invention.

As already noted, a difference between the two examples described above is the shape of the first pattern, and the manner in which it is created. FIG. 10 is an operational flow diagram illustrating another example process for creating the initial pattern in accordance with one embodiment of the invention. FIG. 11 is a diagram illustrating data representations that can be used to arrive at the initial pattern in accordance with one embodiment of the invention. Particularly, the example described with reference to FIGS. 10 and 11 is the example used to create initial pattern 205 of FIG. 8. Referring now to FIGS. 8, 10, and 11 at operation to 226, the first and second logic elements are selected. At operation 228 a representation of the first logic element is retained. This can he seen with reference to FIGS. 8 and 10 at 205 where a left-facing L-shaped pattern is retained at the center of the pattern.

At operation 232, a representation of the first element is resized and retained as a negative image. In this example, it is resized by three spacer widths. This is illustrated in FIG. 11 at 245 where element 95 is defined as a space. As noted in the prior example, in another embodiment, it could be increased by two spacer widths w1, and a width w2. At operation 234, a representation of the second element is resized by an spacer width and retained as a negative image. The sizing and the representation 97 are illustrated in FIG. 11 at 250.

Then, at operation 236 the resized first and second elements 95, 97 are combined as illustrated in FIG. 11 at 255. In this example, the resized first and second elements 95, 97 are OR'd together. Next, at 238 a representation of the retained first element is AND-NOT'd with the combined resized first and second elements 95, 97 to arrive at the initial pattern 205.

In one embodiment, the invention can be implemented such that all of the critical features of the layout elements are defined in one exposure. Indeed, as the examples above illustrate, the critical features for the sample layout elements are defined by the exposure for the initial pattern, at least indirectly. Additionally, in embodiments such as those described above, the critical edges can he defined at the first exposure allowing self-alignment to occur. Accordingly, in these embodiments, a second exposure can he used for the trim level, and additional exposures are not required to create larger width portions of the elements.

In a further embodiment, the examples described comprise a form of double-exposure double patterning, but from a data processing perspective rather than from a lithography perspective. More particularly, in the examples described above, the layout elements were split into two groupings as part of the process of defining the geometry of the initial shape. However, elements from these groups are operated on mathematically (for example, through enlargement and simple Boolean combinations of the original shapes as these examples illustrate) and, accordingly, the data was split (i.e. like double exposure) however the lithography operations were in the same process. In other words, unlike double-exposure double patterning, a second lithography operation was not required to pattern the second element.

In embodiments described above, spacer material is used to define dimensions and placement of the layout elements. However, conventional spacer processes can exhibit larger than desired variations in spacer width due to variations in pattern density. However, as the above examples illustrate, in one embodiment a spacer material is used to define spaces between the elements rather than the feature itself. Accordingly, variations in spacer dimensions might be less critical in such implementations.

Additionally, in order to reduce the variation in spacer width, additional fill or dummy patterns can be added in low-density areas of the layout to make the loading of the pattern more uniform. For example, patterns with no electrical function can be added to areas of the substrate where there are few or no actual device patterns to arrive at a more uniform pattern density across the substrate, or across desired areas of the substrate. Increasing the uniformity of the pattern density can help to improve the uniformity of spacer deposition and thus lead to a more uniform spacer width across the various elements. These additional fill patterns can, in one embodiment, be deposited during deposition of the initial pattern, and removed using the trim mask. Accordingly, this process can be implemented so as to not require an additional mask layer. Additionally, the use of fill patterns can be applied to other spacer patterning, operations in addition to those described herein.

At smaller dimensions such as, for example, at 45 nm and below, conventional wisdom indicates that poly-level layouts for logic applications should be gridded layouts or litho-friendly layouts to improve printability of the patterns. Such a gridded pattern also helps place the spacer in a more uniform environment and therefore achieves better spacer uniformity. At the edge of the cells, additional patterns can he placed to further improve the uniformity. As noted above, the use of fill patterns can be applied to other spacer patterning operations in addition to those described herein.

In one embodiment, the width of the spacer can be modeled by taking into account the deposition process as well as the etch process. In particular, dependency on the proximity can, in one embodiment, be accurately modeled to help place additional patterns to prevent or reduce critical dimension variation.

In one embodiment, the spacer process does not require optical proximity correction (OPC) to correct the size of the spacer, because spacer printing is governed by the thin film deposition and etch operations rather than lithography. Accordingly, dimensions of the spacer patterns are not influenced by lithographic processing. Because feature placement can be influenced by lithographic processing, the OPC can he used for the first layer (the initial pattern) to help ensure that the lines are properly placed.

The printing of the initial feature can he done using a thin hard mask such as, for example, silicon oxide or silicon nitride, on top of a thick layer such as a carbon-based material. The thickness of the layer can be adjusted to achieve a desired spacer thickness and width. For the latter processing operations, the material used to fill the pattern can be the final material needed for the layout elements, or it could he a hard mask that will he used to etch a thick underlying layer (carbon-based material). Ultimately, this stack can be used as a mask to etch the underlying material.

In the example illustrated with respect to FIGS. 4 and 5, the edges defined for the pattern at 80 would benefit from OPC.

For example, OPC can be used to define 80 and therefore to define the final structure 77 and it could also define the structure 78. However, for structure 78, the width of the spacer needs to be taken into account. In this case, if the model of the spacer width is known, it can be accounted for in the OPC calculation for the pattern at 80 in order to make sure that structure 78 is properly sized.

Figure 1:
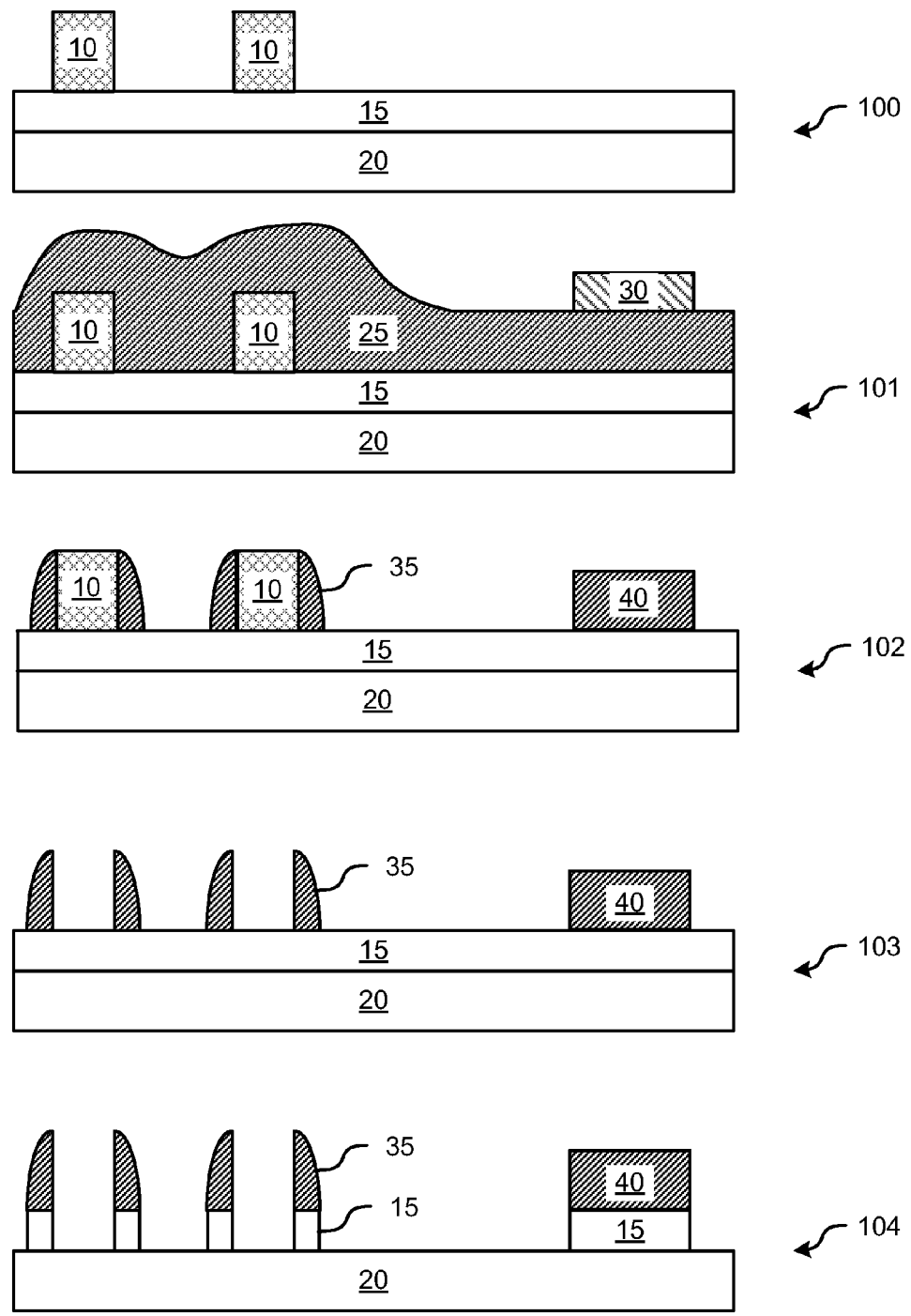
FIG. 1 is a diagram illustrating one example of spacer or self-aligned double patterning.
Figure 2:
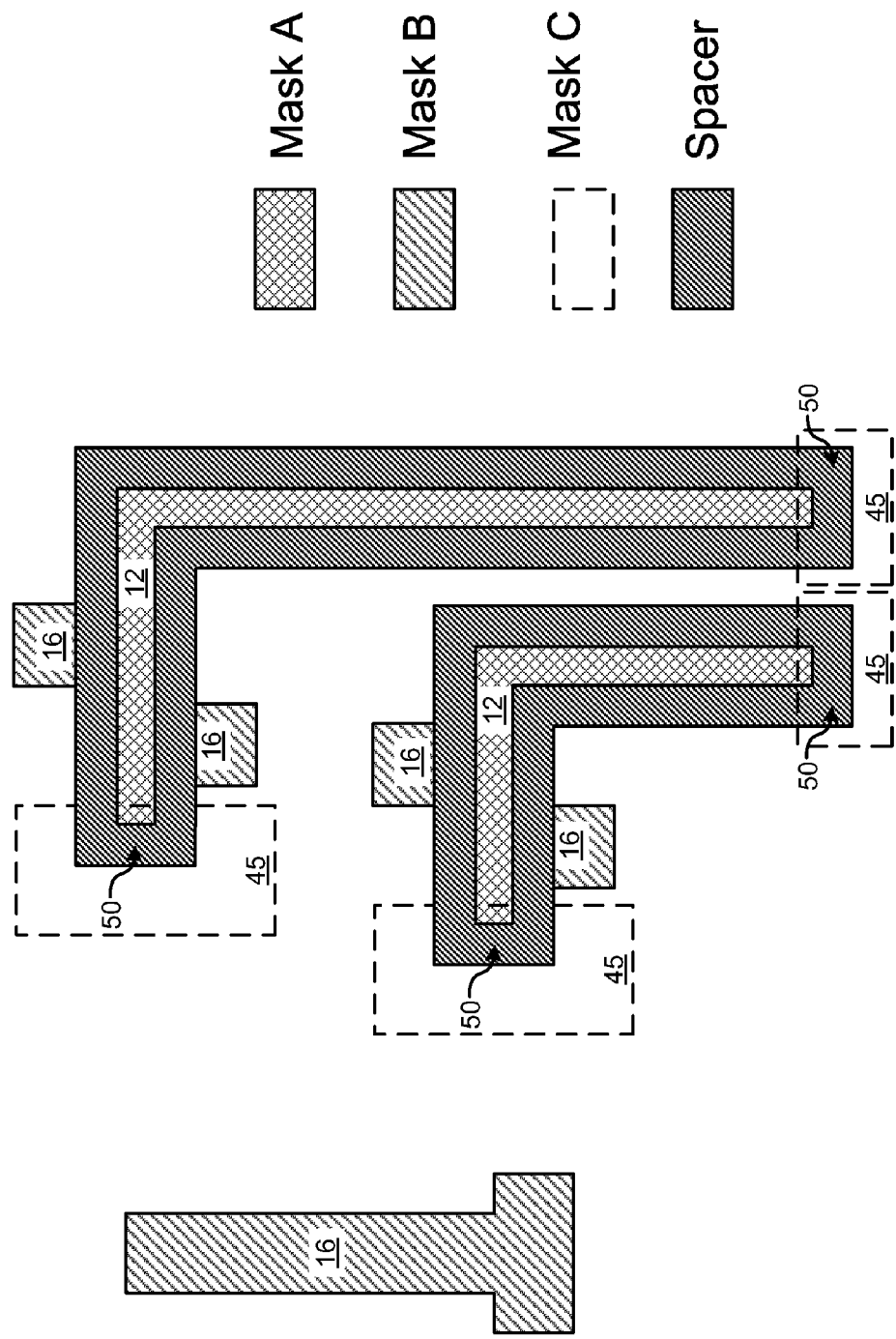
FIG. 2 is a diagram illustrating a top view of a self-aligned double patterning process and masks used to make the illustrated features.

In the examples illustrated above, it can he seen at the example process requires only two lithography levels (first exposure and trim) as compared to three lithography levels for other spacer techniques such as those described with reference to FIGS. 1 and 2.

The term substrate can be used to refer to any material onto which a layer of material is disposed. Substrates can be comprised of any of a number of materials or combinations of materials including metals, ceramics, plastics, glass and other materials. Substrates can include semiconductor substrates such as, for example, GaAs, Si, SiGe or any other semiconductor material, and can include, for example, wafers and dice or any other semiconductor structures, including structures in the process of fabrication, having one or more layers formed thereon.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 12:
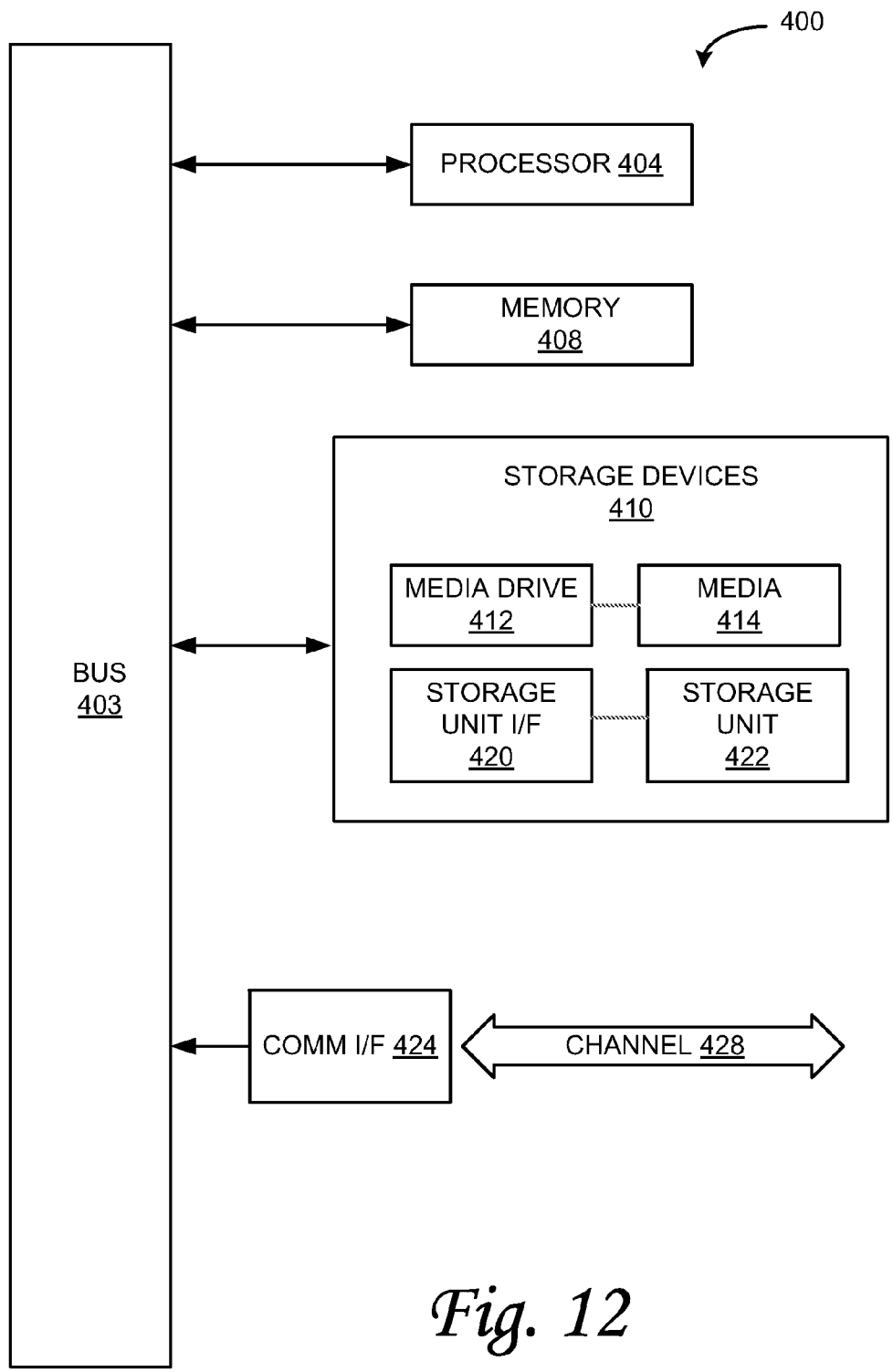
FIG. 12 is a simplified block diagram illustrating an example-computing module in accordance with one embodiment of the invention.

As used herein, the term module at describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might he implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 12. Various embodiments are described in terms of this example-computing module 400. After reading this description, it will become apparent to a person skilled in the relevant art how to implement the invention using other computing modules or architectures.

Referring now to FIG. 12, computing module 400 may represent, for example, computing or processing capabilities found within desktop, laptop and notebook computers; mainframes, supercomputers, workstations or servers; or any other type of special-purpose or general-purpose computing devices as may he desirable or appropriate for a given application or environment. Computing module 400 might also represent computing capabilities embedded within otherwise available to a given device. For example, a computing module might be found in other electronic devices. Computing module 400 might include, for example, one or more processors or processing devices, such as a processor 404. Processor 404 might be implemented using a general-purpose or special-purpose processing engine such as, for example, a microprocessor, controller, or other control logic. In the example illustrated in FIG. 12, processor 404 is connected to a bus 403 or other communication medium to facilitate interaction with other components of computing module 400.

Computing module 400 might also include one or more memory modules, referred to as main memory 408. For example, preferably random access memory (RAM) or other dynamic memory, might he used for storing information and instructions to be executed by processor 404. Main memory 408 might also be used for storing temporary variables or other intermediate information during execution of instructions to be executed by processor 404. Computing module 400 might likewise include a read only memory ("ROM") or other static storage device coupled to bus 403 for storing static information and instructions for processor 404.

The computing module 400 might also include one or more various forms of information storage mechanism 410, which might include, for example, a media drive 412 and a storage unit interface 420. The media drive 412 might include a drive or other mechanism to support fixed or removable storage media 414. For example, a hard disk drive, a floppy disk drive, a magnetic tape drive, an optical disk drive, a CD or DVD drive (R or RW), or other removable or fixed media drive. Accordingly, storage media 414, might include, for example, a hard disk, a floppy disk, magnetic tape, cartridge, optical disk, a CD or DVD, or other fixed or removable medium that is read by, written to or accessed by media drive 412. As these examples illustrate, the storage media 414 can include a computer usable storage medium having stored therein particular computer software or data.

In alternative embodiments, information storage Mechanism 410 might include other similar instrumentalities for allowing computer programs or other instructions or data to be loaded into computing module 400. Such instrumentalities might include, for example, a fixed or removable storage unit 422 and an interface 420. Examples of such storage units 422 and interfaces 420 can include a program cartridge and cartridge interface, a removable memory (for example, a flash memory or other removable memory module) and memory slot, a PCMCIA slot and card, and other fixed or removable storage units 422 and interfaces 420 that allow software and data to be transferred from the storage unit 422 to computing module 400.

Computing module 400 might also include a communications interface 424. Communications interface 424 might be used to allow software and data to be transferred between computing module 400 and external devices. Examples of communications interface 424 might include a modem or softmodem, a network interface (such as an Ethernet, network interface card, WiMedia, 802.XX or other interface), a communications port (such as for example, a USB port, IR port, RS232 port Bluetooth interface, or other port), or other communications interlace. Software and data transferred via communications interlace 424 might typically be carried on signals, which can be electronic, electromagnetic, optical or other signals capable of being exchanged by a given communications interface 424. These signals might be provided to communications interface 424 via a channel 428. This channel 428 might carry signals and might he implemented using a wired or wireless medium. Some examples of a channel might include a phone line, a cellular link, an RE link, an optical link, a network interface, a local or wide area network, and other wired or wireless communications channels.

In this document, the terms "computer program medium" and "computer usable medium" are, used to generally refer to media such as, for example, memory 408, storage unit 420, media 414, and signals on channel 428. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 400 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can he included in the invention. The invention is not restricted to the illustrated example architectures or configurations, but the desired features can he implemented using a variety of alternative architectures and configurations. Indeed, it will be apparent to one of in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the operations are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not he limited by any of the above-described exemplary embodiments.

Terms and phrases used in this document, and variations thereof, unless otherwise expressly stated, should be construed as open ended as opposed to limiting. As examples of the foregoing: the term "including" should he read as meaning "including, without limitation" or the like; the term "example" is used to provide exemplary instances of the item in discussion, not an exhaustive or limiting list thereof; the terms "a" or "an" should be read as meaning "at least one." "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would he apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also he read as "and/or" unless expressly stated otherwise. Furthermore, although items, elements or components of the invention may he described or claimed in the singular, the plural is contemplated to he within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further he distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not he construed as mandating a particular architecture or configuration.

The invention claimed is:

1. A method of patterning layout elements during semiconductor device fabrication, comprising:
   determining an initial pattern, wherein determining the initial pattern includes:
     selecting first and second layout elements,
     resizing the first layout element,
     defining a data representation based on the resized first layout element, and
     combining the data representation based on the resized first layout element with a data representation of the second layout element;
   depositing a layer of a first material and patterning the layer to form the initial pattern, wherein the initial pattern defines critical features of the layout elements using a single exposure;
   depositing spacer material over the initial pattern on a substrate and etching the spacer material such that the spacer material remains adjacent to the first pattern but is removed from other areas of the substrate;
   removing the initial pattern from the substrate while leaving the spacer material in a spacer pattern;

filling the spacer pattern with final material; and trimming the filled pattern to remove portions of the final material beyond dimensions of the layout elements.

2. The method of claim 1, further comprising removing remaining spacer material after trimming the filled pattern.

3. The method of claim 1, wherein the:

data representation based on the resized first layout element is a data representation of an outline of a resized first layout element.

4. The method of claim 3, wherein combining the data representation of the outline of the first element with the data representation of the second element comprises logical OR'ing the data representation of the outline of the first element with the data representation of the second element.

5. The method of claim 3, wherein defining a data representation based on the resized first layout element comprises resizing the first layout element, selecting an outline of the resized first layout element and defining a data representation of the outline.

6. The method of claim 5, wherein resizing the first layout element comprises resizing the first layout element by two spacer widths in each dimension.

7. The method of claim 1, said determining the initial pattern further comprising:

combining a data representation of the first layout element with the combination of data representations of the resized first layout element and the second layout element.

8. The method of claim 1, wherein combining the data representation based on the resized first layout element with the data representation of the second layout element comprises logical OR'ing the data representation based on the resized first layout element with the data representation of the second layout element.

9. The method of claim 7, wherein combining a data representation of the first element with the combination of data representations of the resized first element and the second element comprises logical AND-NOT'ing a data representation of the first element with the combination of data representations of the resized first element and the second element.

10. The method of claim 1, wherein the spacer pattern is used to define spaces between the layout elements rather than the elements themselves.

11. A semiconductor device having a plurality of layers, wherein a layer comprises a series of elements formed by a spacer double patterning process, the process comprising:

determining an initial pattern, wherein determining the initial pattern includes:

selecting first and second layout elements, resizing the first layout element, defining a data representation based on the resized first layout element, and combining the data representation based on the resized first layout element with a data representation of the second layout element;

depositing a layer of a first material and patterning the layer to form the initial pattern, wherein the initial pattern defines critical features of the layout elements using a single exposure;

depositing spacer material over the initial pattern on a substrate and etching the spacer material such that the spacer material remains adjacent to the first pattern but is removed from other areas of the substrate;

removing the initial pattern from the substrate while leaving the spacer material in a spacer pattern;

filling the spacer pattern with final material; and trimming the filled pattern to remove portions of the final material beyond dimensions of the layout elements.

12. The semiconductor device of claim 11, wherein the layout elements are formed using only two mask layers.

13. The semiconductor device of claim 11, wherein the data representation based on the resized first layout element is a data representation of an outline of a resized first layout element.

14. The semiconductor device of claim 13, wherein combining the data representation of the outline of the first element with the data representation of the second element comprises logical OR'ing the data representation of the outline of the first element with the data representation of the second element.

15. The semiconductor device of claim 13, wherein defining a data representation based on the resized first layout element comprises resizing the first layout element, selecting an outline of the resized first layout element and defining a data representation of the outline.

16. The semiconductor device of claim 15, wherein resizing the first layout element comprises resizing the first layout element by two spacer widths in each dimension.

17. The semiconductor device of claim 11, said determining the initial pattern further comprising:

combining a data representation of the first layout element with the combination of data representations of the resized first layout element and the second element.

* * * * *